(12) United States Patent
Hirata et al.

(10) Patent No.: US 6,431,878 B1
(45) Date of Patent: Aug. 13, 2002

(54) SOCKET FOR PGA PACKAGE (75) Inventors: Toshihisa Hirata, Yamato; Masami Sasao, Kanagawa; Takaaki Hirayama, Odawara, all of (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/863,519

(22) Filed: May 23, 2001

(51) Int. Cl.$^7$ ............................................... H01R 12/00
(52) U.S. Cl. ........................................ 439/70; 439/342
(58) Field of Search ........................... 439/70, 342, 885

(56) References Cited

U.S. PATENT DOCUMENTS

| | | | |
|---|---|---|---|
| 5,597,320 A | 1/1997 | Wang et al. | 439/342 |
| 5,692,920 A | 12/1997 | Banakis et al. | 439/342 |
| 5,791,929 A | 8/1998 | Banakis | 439/342 |
| 5,934,951 A | 8/1999 | Lai et al. | 439/876 |
| 5,989,049 A | 11/1999 | Walkup et al. | 439/342 |
| 5,997,317 A | 12/1999 | Pei et al. | 439/342 |
| 6,086,401 A | 7/2000 | Hsiung et al. | 439/342 |
| 6,095,842 A | 8/2000 | Lin | 439/342 |
| 6,099,326 A | 8/2000 | Lin | 439/83 |
| 6,113,412 A | 9/2000 | Lin | 439/342 |
| 6,132,222 A | 10/2000 | Wang et al. | 439/70 |
| 6,139,377 A * | 10/2000 | Chen | 439/885 |
| 6,142,810 A | 11/2000 | Hsiao et al. | 439/342 |
| 6,142,811 A | 11/2000 | Lin | 439/342 |
| 6,015,001 A | 12/2000 | Hsiao | 439/342 |
| 6,196,886 B1 * | 3/2001 | Sato | 439/885 |
| 6,213,807 B1 | 4/2001 | Huang et al. | 439/342 |
| 6,217,362 B1 | 4/2001 | Pei et al. | 439/342 |

* cited by examiner

Primary Examiner—Tulsidas Patel
(74) Attorney, Agent, or Firm—Robert J. Zeitler (57) ABSTRACT

A socket for a PGA package includes a planar insulative housing for mounting a plurality of terminals in grid array fashion. Each of the terminals has a solder tail projecting from one side surface of the insulative housing to be soldered to a printed circuit board. Each of the terminals includes a planar main portion extending in the direction of mounting to the insulative housing, an anchor portion for engaging with the insulative housing on side edges of the main body, a contact piece folded back into generally U-shaped configuration from a lower end of the main body and mutually opposing to the main body, and a solder tail extending toward the printed circuit board. The contact piece has a contact portion on an outside surface thereof for contacting with a pin of the PGA package.

20 Claims, 9 Drawing Sheets

PRIOR ART

FIG. 13

PRIOR ART

FIG. 14

PRIOR ART

SOCKET FOR PGA PACKAGE

FIELD OF THE INVENTION

The present invention relates generally to a socket for a PGA (pin grid array package) to which the PGA package can be connected.

DESCRIPTION OF THE RELATED ART

Figure 12:
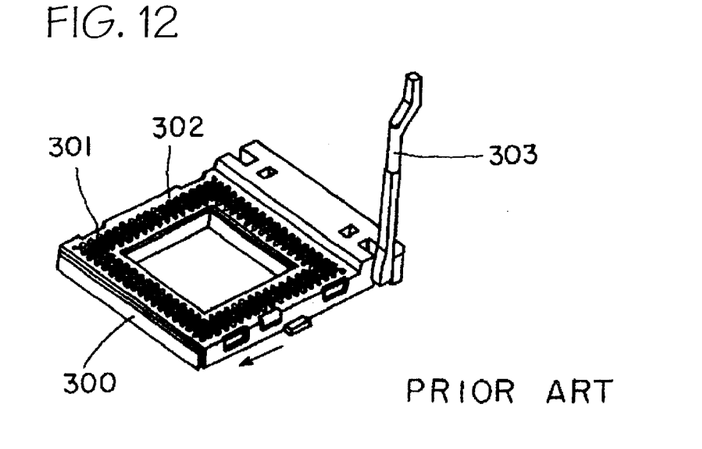
FIG. 12 is a perspective view showing a conventional socket for a PGA package.

Conventionally, a socket for a PGA package as shown in FIG. 12 is well known in the art (See Japanese Unexamined Patent Publication (Kokai) No. Heisei 9-204969 and Japanese Unexamined Patent Publication (Kohyo) No. Heisei 10-508143 and the like, for example). The socket for the PGA package comprises a planar insulative housing 300 in which terminals are located in grid array fashion, and a cover 302 including pin insertion holes 301 formed in grid array fashion corresponding to the respective terminals. It is possible to slide the cover 302 on the insulative housing 300 by operation of a lever 303 and the like. Upon sliding the cover 302, pins of the PGA package respectively opposing to a contact piece of the respective terminals through the respective pin insertion holes 301 are adapted for engagement with the contact pieces.

Figure 13:
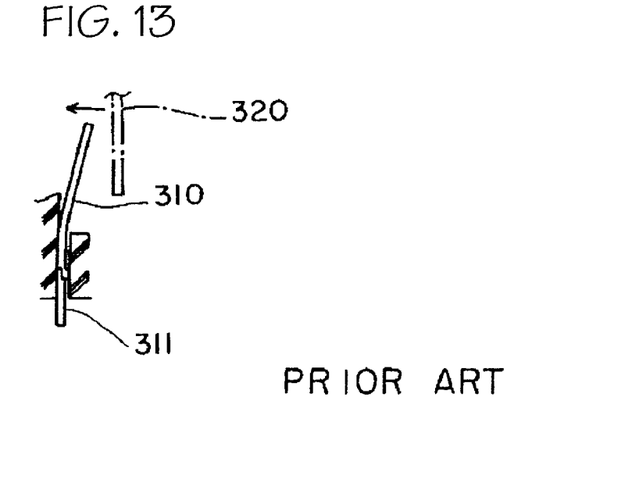
FIG. 13 is a section view showing a conventional terminal.
Figure 14:
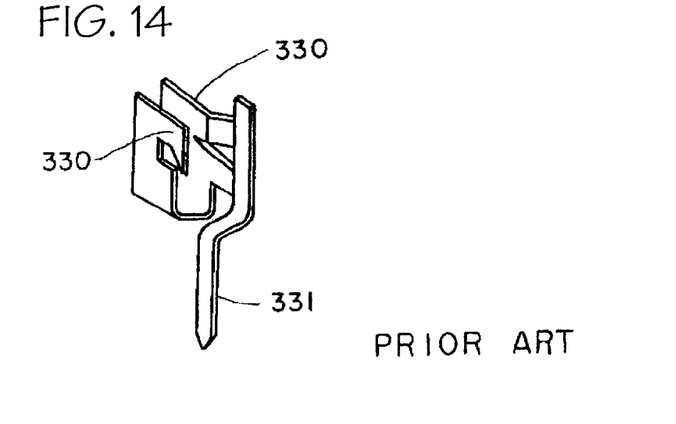
FIG. 14 is a perspective view showing a conventional terminal.

The respective terminals mounted on the insulative housing include a solder tail extending from a bottom surface of the insulative housing and soldered to circuit pads of a printed circuit board. With the structure of the terminal, the structure as shown in FIG. 13 (see Japanese Unexamined Utility Model Publication (Kokai) No. Heisei 9-35838) and the structure as shown in FIG. 14 Publication (Kokai see Japanese Unexamined Utility Model No. Beisei 7-11787) are been well known in the art. With the structure of the terminal shown in FIG. 13, the reference numeral 310 denotes a contact piece, and the reference numeral 311 denotes a solder tail. Upon sliding the cover 302, a pin 320 is moved as indicated by arrow to contact with the contact piece 310. With the structure of the terminal shown in FIG. 14, the reference numerals 330 denote a pair of mutually opposing contact pieces, and the reference numeral 331 denotes a solder tail. Upon sliding the cover 302, the pin is moved between the mutually opposing contact pieces 330 to contact with the contact pieces 330.

With the typical structure of the terminal as set forth above, it is difficult to hold the terminal by the insulative housing in the structure of FIG. 13, since a moment is caused on the terminal when the pin of the package is engaged with the contact piece. Accordingly, this moment necessitates means such as provision of an anchor for engaging with the insulative housing in the direction of thickness of the terminal. Furthermore in the structure of FIG. 14, the terminal becomes relatively large upon being spread out, so that it lacks for process yield in case of stamping it from a resilient metal sheet. In conjunction therewith, it is difficult to make the terminal, since it is necessary to balance the resilience of the mutually opposing contact pieces.

SUMMARY OF THE INVENTION

The present invention has been worked out in order to solve the problems set forth above. Therefore, it is an object of the present invention to provide a socket for a PGA package for mounting terminals having a structure adapted for being firmly held on an insulative housing, and stably engaging with pins of the PGA package.

To accomplish the above-mentioned object, the present invention contemplates the provision of a socket for a PGA package including a planar insulative housing for mounting a plurality of terminals in grid array fashion, each said terminals having a solder tail projecting from one side surface of said insulative housing to be soldered to a printed circuit board, each said terminals may comprise:

a planar main portion extending in the direction of mounting to said insulative housing;

an anchor portion for engaging with said insulative housing on side edges of said main body;

a contact piece folded back into generally U-shaped configuration from a lower end of said main body and mutually opposing to said main body;

a solder tail extending toward said printed circuit board; and     said contact piece having a contact portion on an outside surface thereof for contacting with a pin of said PGA package.

According to the socket for the PGA package of the present invention, the terminal has a construction in which the contact piece is folded back into generally U-shaped configuration from the lower end of the main body to be opposed to the main body, and the contact portion engaging with the pin of the PGA package is formed on the outside surface of the contact piece. Accordingly, the contact piece with which the pin is engaged, is resiliently deformed about an U-shaped folded back portion in the direction of pivotal motion, and then this deformation force is transferred to the main body. Since the main body of the terminal can be mated with the inner wall of the terminal mounting portion of the insulative housing, it is possible to bear the deformation force by the whole area of the main body. As a result, it is possible to avoid causing the rotational moment on the terminal. Furthermore, the engagement between the pins and the contact pieces are also stabilized. Still further, in case of stamping the terminals (terminal blanks) from the resilient metal sheet, it is possible to arrange them for a small pitch to improve the process yield of materials, since each terminal has a construction in which the contact piece is folded back so as to be opposed to the main body.

The present invention will be understood more fully from detailed description given herebelow and from the accompanying drawings of the preferred embodiment of the present invention, which, however, should not be taken to be limitative to the invention, but are for explanation and understanding only.

DESCRIPTION OF PREFERRED EMBODIMENTS

The present invention will be discussed hereinafter in detail in terms of preferred embodiments of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
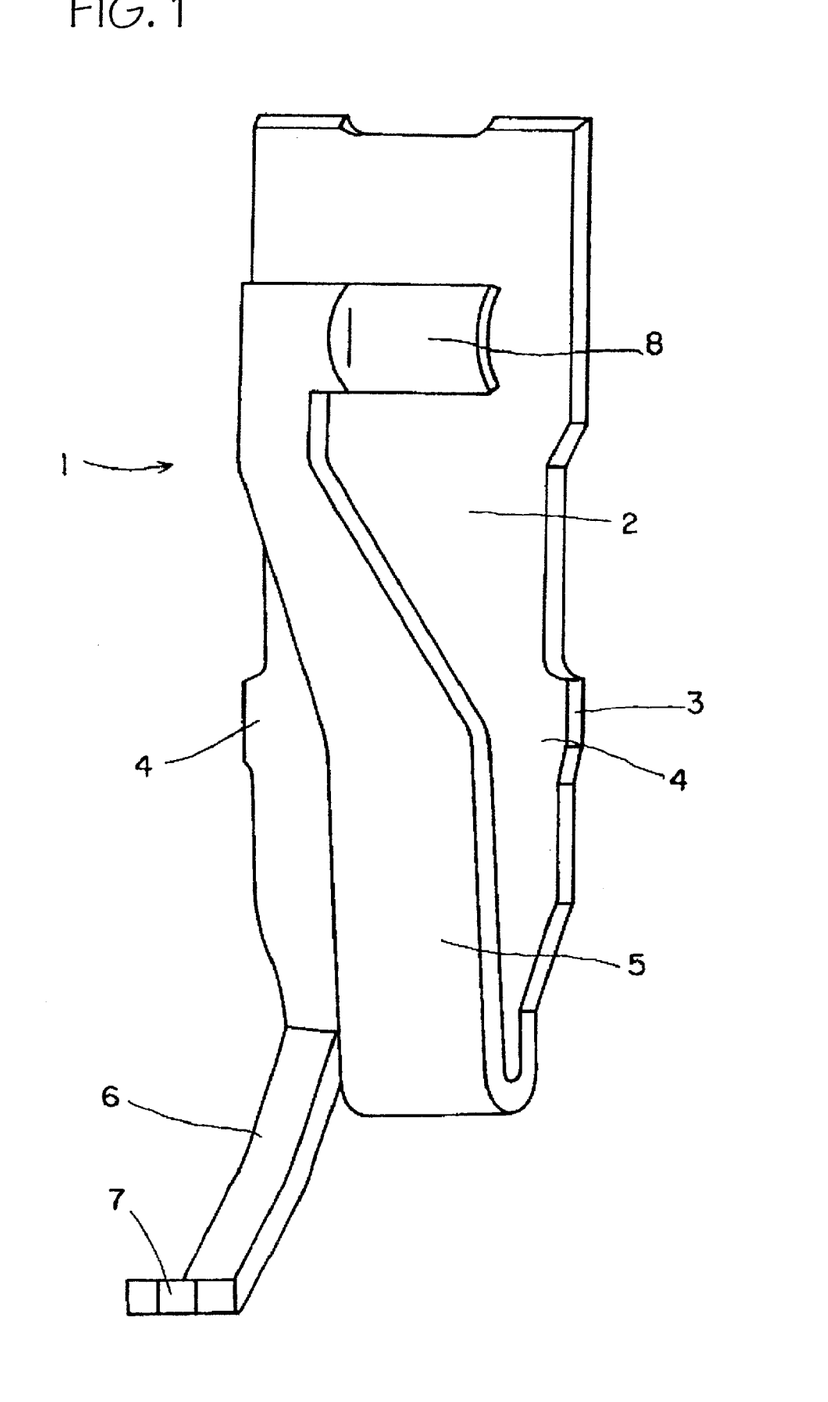
FIG. 1 is a perspective view of a terminal according to one embodiment of the present invention.
Figure 2:
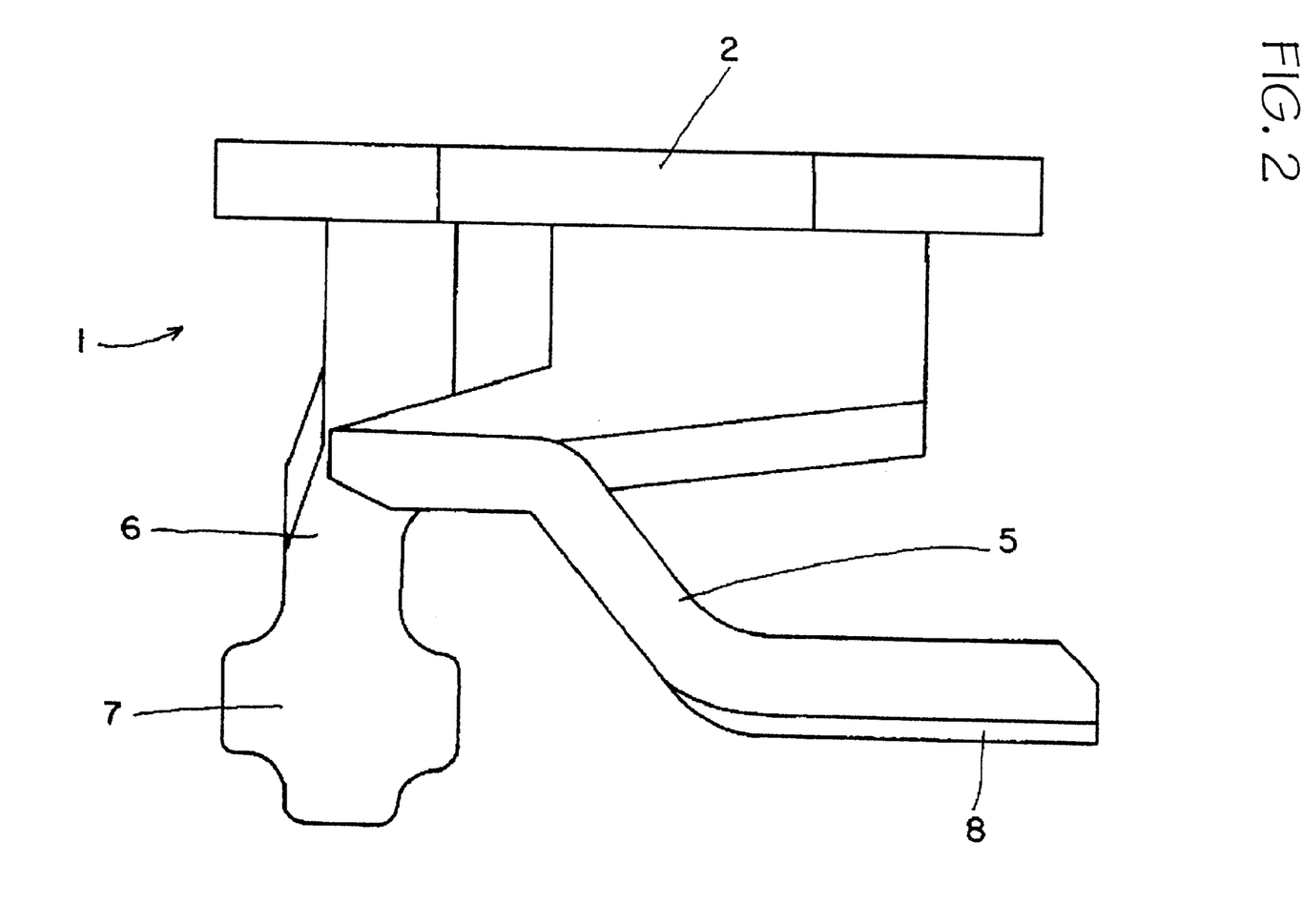
FIG. 2 is a top plan view of the terminal according to one embodiment of the present invention.

FIGS. 1 and 2 are, respectively, illustration of one embodiment of a terminal 1. The terminal 1 is provided with anchor portions 4 each comprising an engaging projection 3 along the side edges of a planar main body 2. A contact piece 5 and a solder tail 6 are respectively extended from the lower end of the main body 2. The contact piece 5 is folded back into generally U-shaped configuration to be opposed to the main body 2. More specifically, the solder tail 6 is obliquely extended downwardly, and provided with a planar solder tail portion 7 at the tip end thereof. The contact piece 5 and the solder tail 6 are respectively extended from the inner side portion with respect to the anchor portion 4 at the lower end of the main body 2. A tip end of the contact piece 5 is laterally extended, and formed into an outwardly directing arch configuration in cross-section to provide a contact portion 8.

Figure 3:
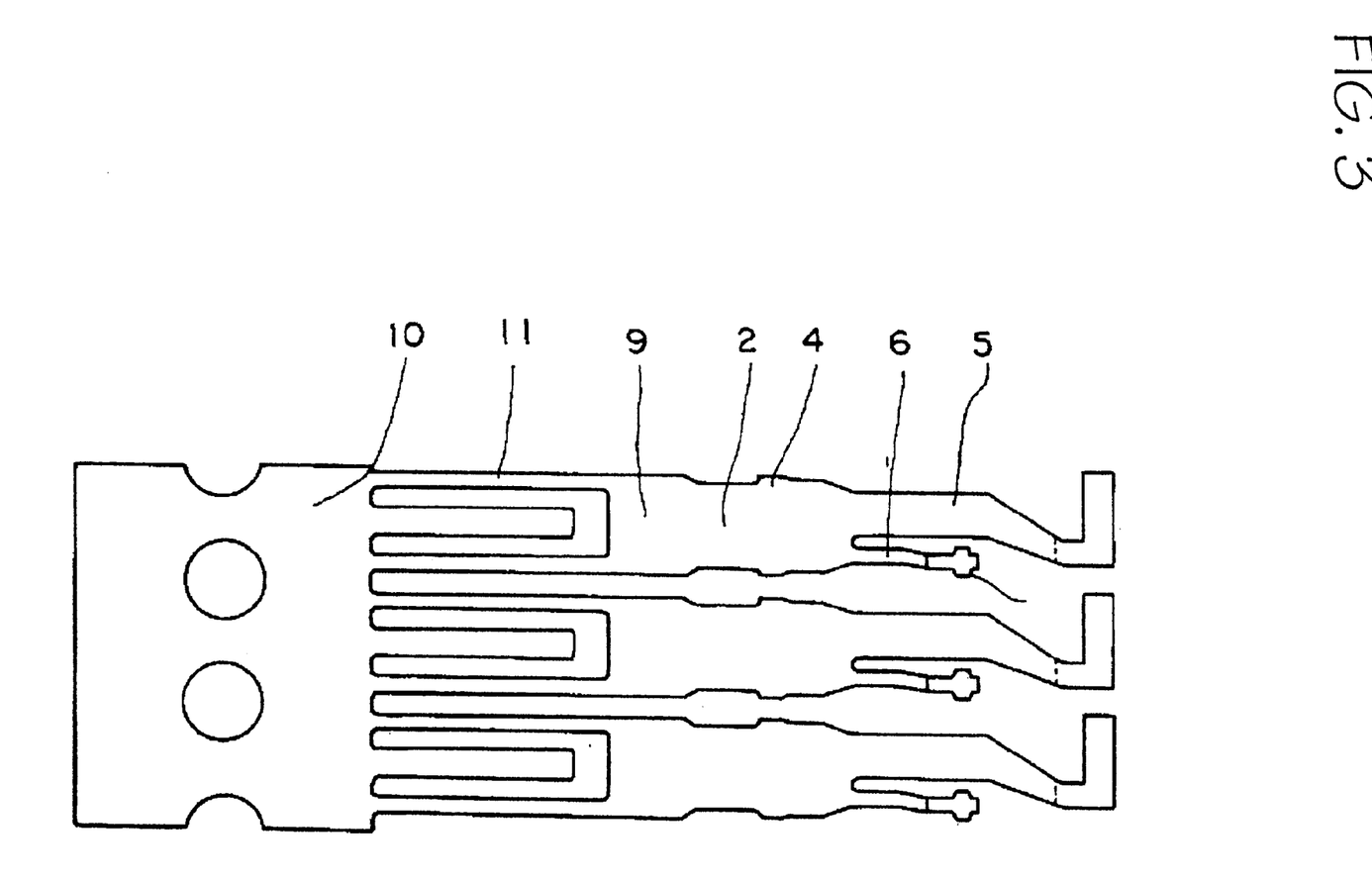
FIG. 3 is a top plan view of a terminal blank stamped from a resilient metal sheet.
Figure 4:
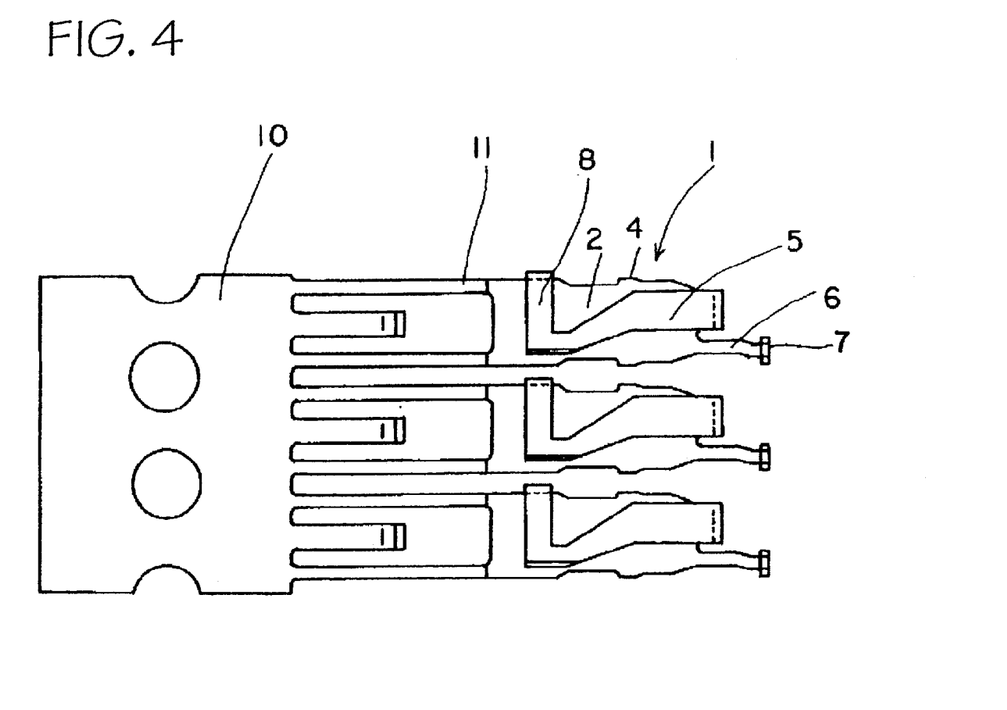
FIG. 4 is a top plan view showing the condition where the terminal is formed from the terminal blank.
Figure 5:
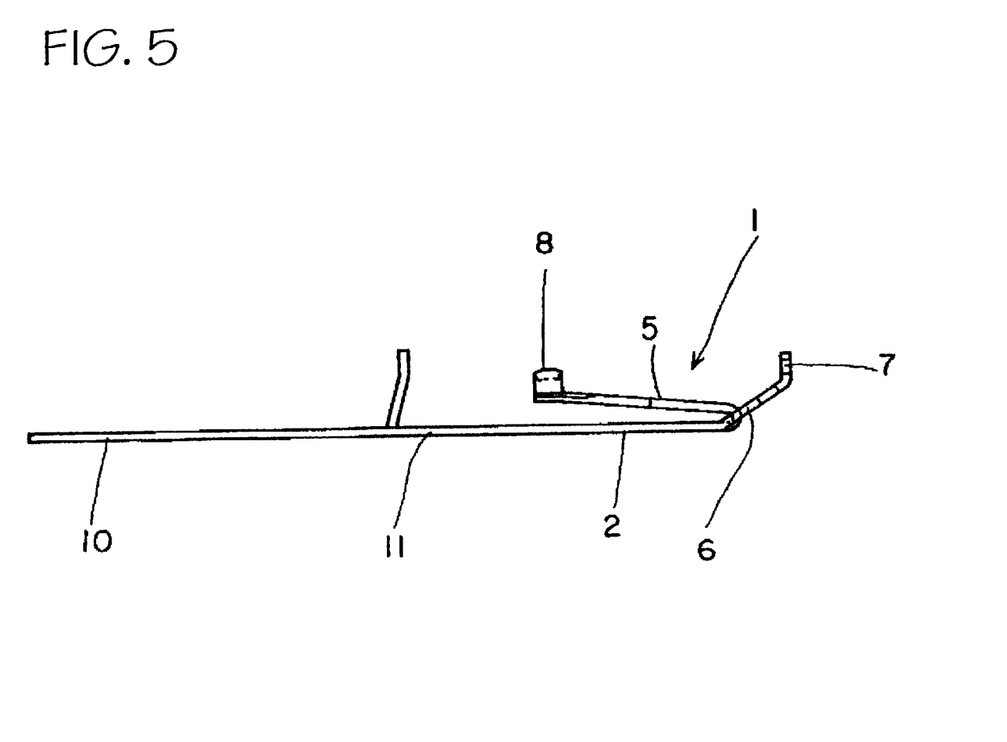
FIG. 5 is a plan view showing the condition where the terminal is formed from the terminal blank.

FIG. 3 is an illustration of terminal blanks 9 stamped from a resilient metal. sheet. Furthermore, FIGS. 4 and 5 are, respectively, illustrations of the manner that the terminal 1 is constructed by forming the terminal blank 9. As shown in each drawing, the terminal blanks 9 and the terminals 1 are stamped and formed in lateral alignment longitudinally of a carrier 10. The carrier 10 and the main body 2 of the terminal 1 are connected via a tab 11, so that it is possible to separate the individual terminal 1 by cutting the tab 11. The arrangement pitch of the terminal blanks 9 and the terminals 1 laterally aligned in the longitudinal direction of the carrier 10 corresponds to the pitch (for example, 1.27 mm pitch) of terminal mounting portions 13 (see FIGS. 6 and 7) provided with the insulative housing 12 constructing the socket for the PGA package in a grid array fashion. Accordingly, it is possible to gang load a plurality of the terminals 1 to the terminal mounting portions 13 arranged in one row.

Figure 6:
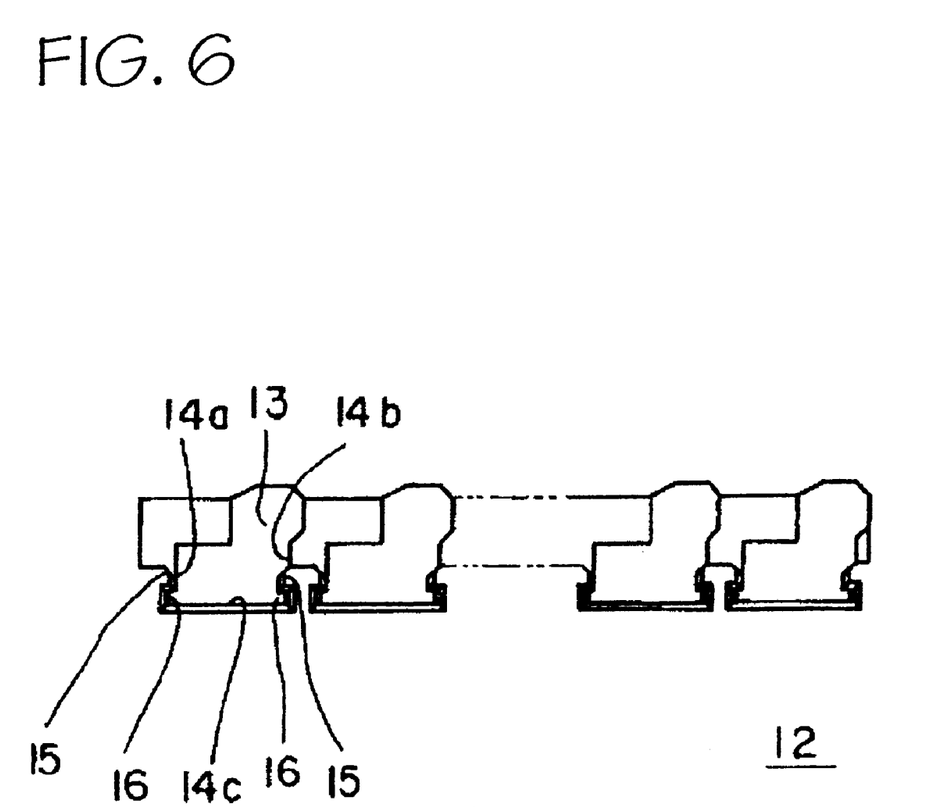
FIG. 6 is a partially enlarged plan view of an insulative housing.
Figure 7:
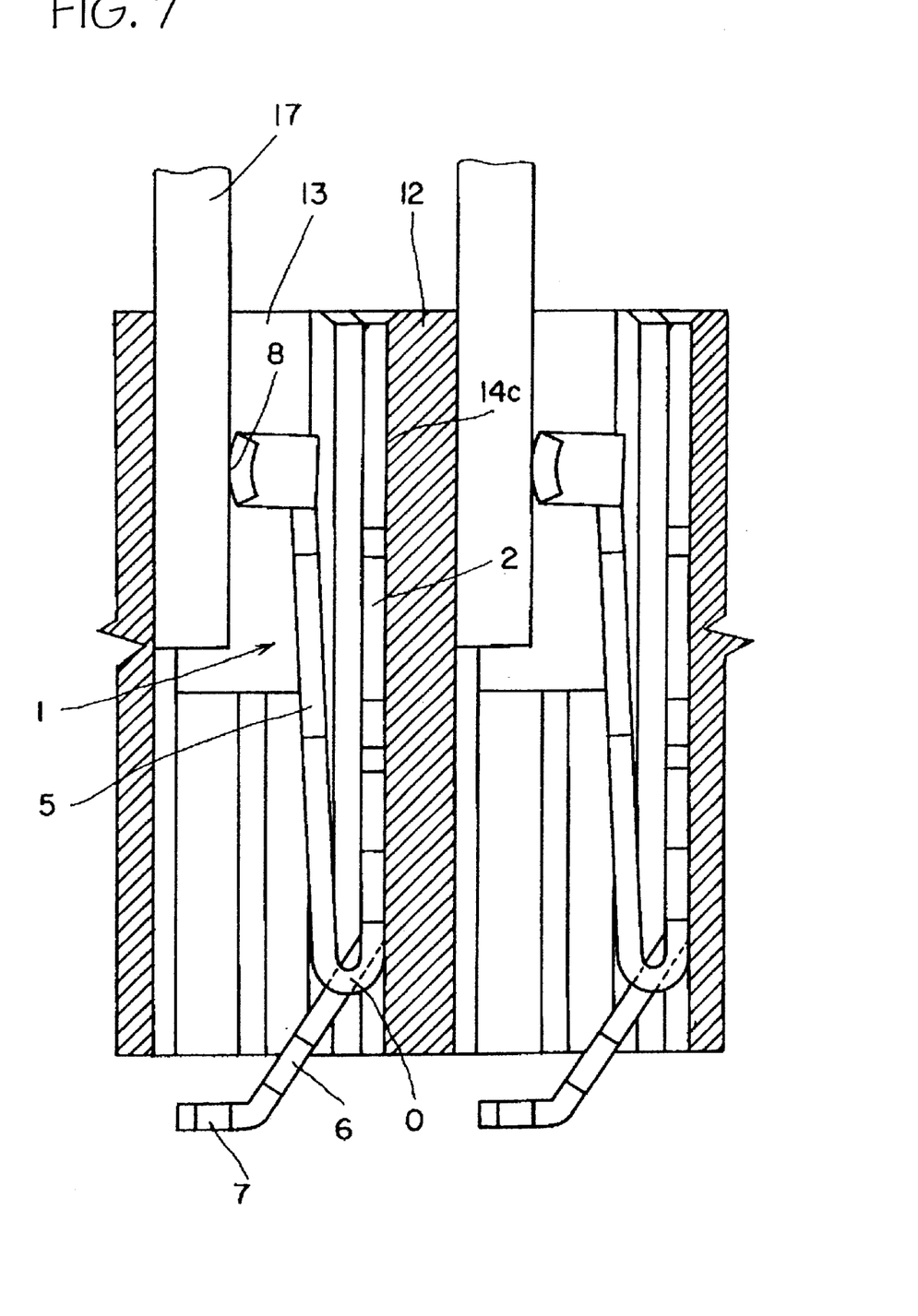
FIG. 7 is a partially enlarges section view of the insulative housing to which the terminals are mounted.
Figure 8:
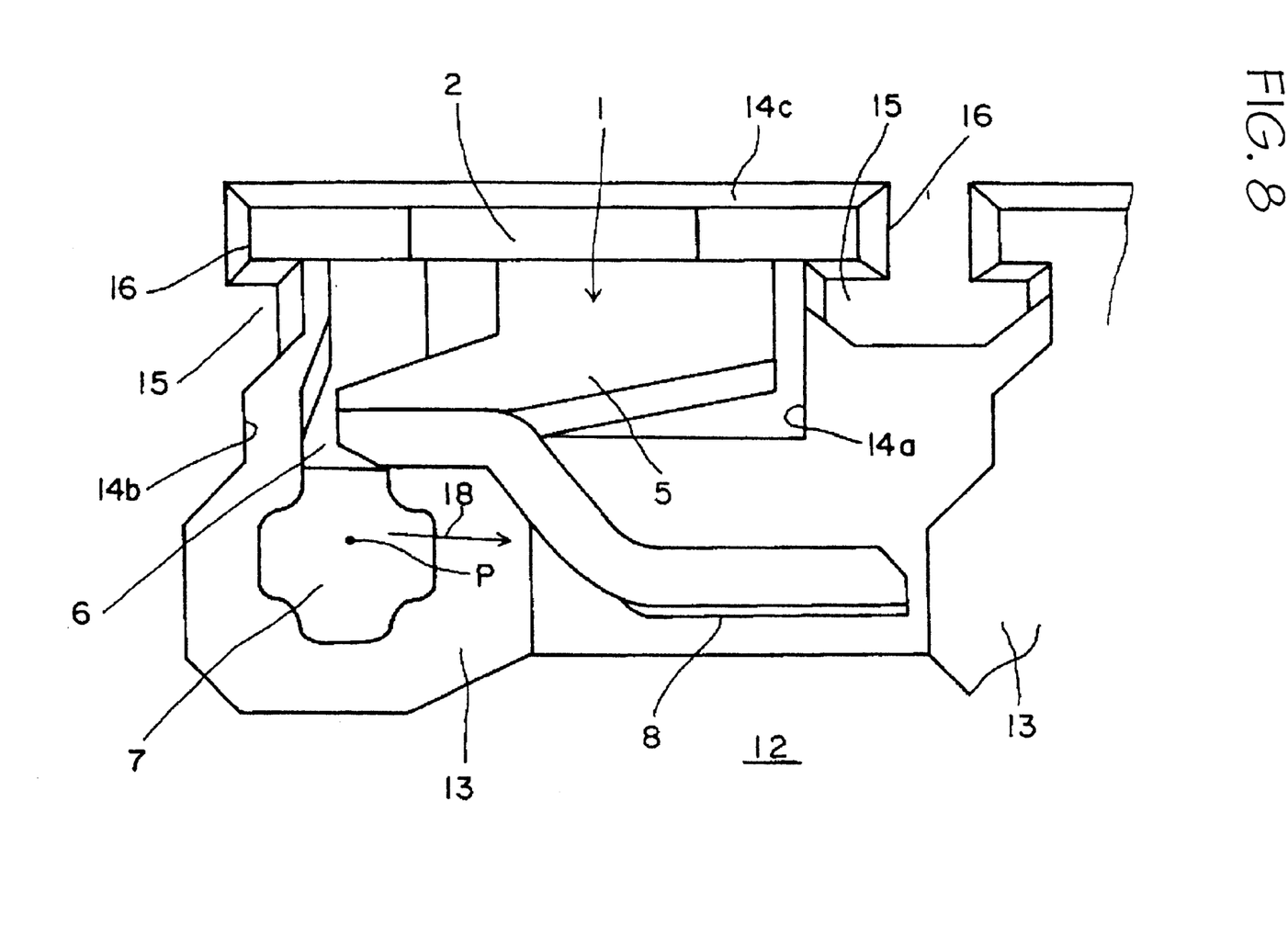
FIG. 8 is a partially enlarged top plan view of the insulative housing to which the terminal is mounted.

FIG. 6 is a partially enlarged top plan view of the insulative housing 12 constructing the socket for the PGA package, shows the terminal mounting portions 13 arranged in one row. By providing the terminal mounting portions 13 arranged in one row in a plurality of rows, the terminal mounting portions 13 are provided in grid array fashion within the insulative housing 12 as a whole. Furthermore, FIG. 7 is a partially enlarged section showing the condition where the respective terminals 1 are mounted to the respective terminal mounting portions 13. FIG. 8 is a partially enlarged top plan view of FIG. 7. It is possible that a plurality of the terminal 1 still connected to the carrier 10 are gang loaded to each row of the terminal mounting portions 13 from the upper surface of the insulative housing 12, i.e., the surface opposite to a printed circuit board (not shown). After mounting them, the portion of the tabs 11 connecting between the carrier 10 and the terminals 1 is cut to separate the respective terminals 1 from the carrier 10.

The terminal mounting portion 13 is extended from the upper surface to the bottom surface of the insulative housing 12. Mutually opposing inner walls 14a, 14b are respectively provided with an overhang portion 15 in the vertical direction thereof, and the respective overhang portions 15 cooperate with an adjacent inner wall 14c to form a mounting groove 16. The respective anchor portions 4 formed at the side edges of the main body 2 are inserted into the mounting grooves 16 with orienting the main body 2 in the mounting direction to mount the terminal 1 to the insulative housing 12. The engaging portion 3 of the respective anchor portions 4 is engaged with the insulative housing 12 to maintain the mounting condition. The overhang portion 15 is positioned between the main body 2 and the contact piece 5 of the terminal 1 to cover the anchor portion 4.

The solder tail 6 provided on the terminal 1 is outwardly projected from the bottom surface of the insulative housing 12 through the terminal mounting portion 13, and extended toward the printed circuit board to which this socket is mounted. Accordingly, it becomes possible that the solder tail portions 7 formed at the tip end of the solder tail 6 are soldered to the circuit pads on the printed circuit board, respectively.

With the socket for the PGA package in which the terminals 1 are mounted to the insulative housing 12 as set forth above, a pin 17 of the PGA package to be slid by a cover (not shown) is moved from the position P to the direction indicated by arrow 18 to engage with the contact portion 8 provided on the outside face at the tip end of the contact piece 5, as shown in FIG. 8. FIG. 7 shows the condition where the pin 17 is engaged with the contact portion 8. The contact piece 5 is engaged with the pin 17 to be pivotably moved to on the side of the main body 2 about a base portion folded back into the U-shaped configuration (which is indicated by the reference numeral 0 in FIG. 7). The deformation force due to this pivotal motion is transferred to the main body 2, and bore by the whole area of the inner wall 14c of the terminal mounting portion 13 with which the main body 2 is contact. Therefore, the pin 17 is engaged with the contact portion 8 under an appropriate contact pressure.

As set forth above, when the pin 17 is engaged with the contact piece 5 of the terminal 1, the deformation force of the contact piece 5 is transferred to the side of the insulative housing 12 through the whole area of the main body 2 to be bore, so that it prevents causing the moment on the terminal 1. Accordingly, it is possible to firmly hold the terminal 1 constantly via engagement between the anchor portion 4 and the insulative housing 12, and also possible to stabilize the engagement between the contact piece 5 and the pin 17.

Furthermore, the terminal has a construction in which the contact piece 5 connected to the lower end of the main body 2 is folded back into the U-shaped configuration to be opposed to the main body 2. Therefore, it is possible to form the respective terminals 1 under the condition where the terminals 1 are laterally aligned with the carrier 10 for a small pitch corresponding to the pitch of the terminal mounting portion 13 on the side of the insulative housing 12.

As a result, a plurality of the terminals 1 can be gang loaded to the insulative housing 12.

Figure 9:
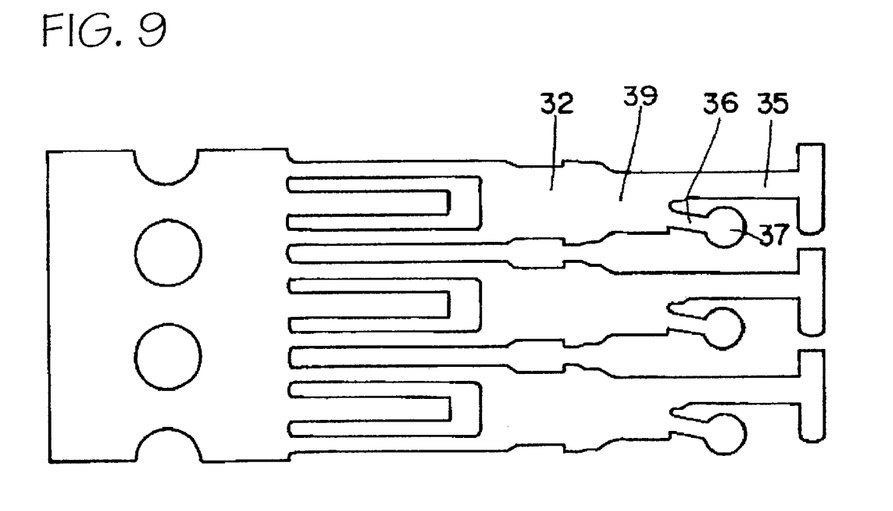
FIG. 9 is a top plan view of the terminal blank for a terminal according to another embodiment of the present.
Figure 10:
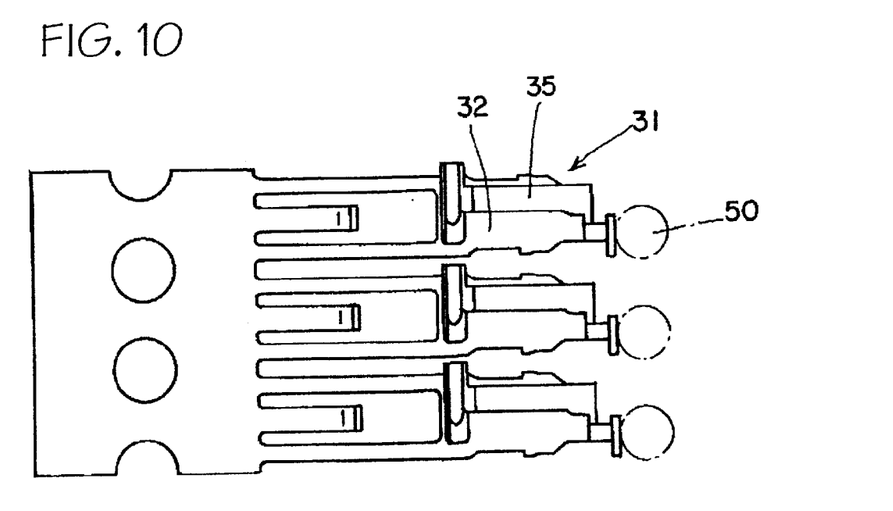
FIG. 10 is a top plan view showing the condition where the terminal is formed from the terminal blank of FIG. 9.
Figure 11:
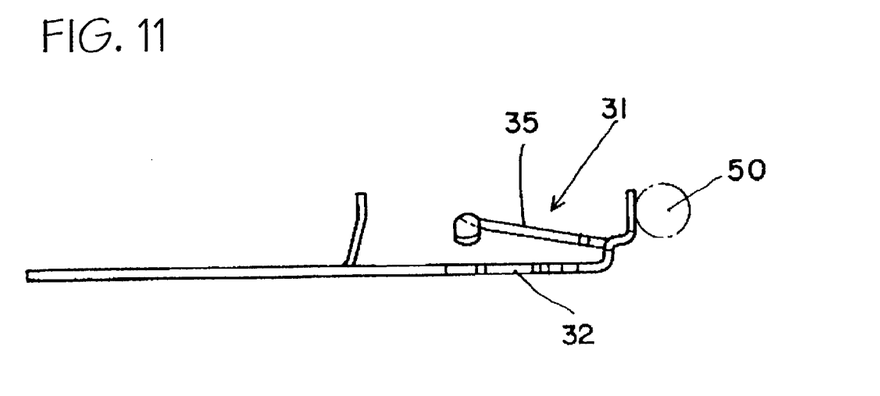
FIG. 11 is a plan view showing the condition where the terminal is formed from the terminal blank of FIG. 9.

FIGS. 9 to 11 respectively show another embodiment of terminals 31 adapted for being gang loaded to the insulative housing 12 as is the case with the preferred embodiment set forth above. FIG. 9 is an illustration of a terminal blank 39, and FIGS. 10 and 11 are respectively illustration of a terminal 31. The configuration of a contact piece 35 is different from that of the contact piece 5 of the above-mentioned embodiment. The contact piece 35 is extended generally straightly from the lower end of a main body 32. The contact piece 35 extending generally straightly permits to reduce inductance of the terminal 31 interposed between the pin 17 of the PGA package and the circuit pad of the printed circuit board as low as possible.

A solder tail portion 37 to be formed at the tip end of a solder tail 36 is generally circular. This circular configuration is meant for mounting a solder ball 50 as indicated by dotted line in FIGS. 10 and 11. In case where the terminal 31 is contact with the printed circuit board by mounting the solder ball 50 to the solder portion 37, it is desirable that the solder tail portion 37 is generally in flush with the bottom surface (the lower surface in FIG. 7) of the insulative housing 12 under the condition where the terminal 31 formed by shortening the solder tail 36 is mounted to the insulative housing 12.

In either of the preferred embodiments set forth above, the solder tails 6 and 36 projecting from the main bodies 2 and 32 are respectively obliquely extended relative to contact pieces 5 and 35 adjacent thereto under the condition where the terminals 1 and 31 are still connected to the carrier 10 as the terminal blanks 9 and 39. In other words, the solder tails 6, 36 are respectively formed in such a manner that distance from the respective contact pieces 5 and 35 becomes greater toward the tip end of the respective solder tails 6, 36. Due to such a configuration, a die assembly is easily removed from the contact pieces 5 and 35 and the solder tails 6 36, when the terminal blanks 9 and 39 are stamped from the resilient metal sheet.

As set forth above, the present invention is contemplated the provision of the terminal including the main body of which the whole area is contact with the inner wall of the terminal mounting portion of the insulative housing, and the contact portion provided on the outside surface of the contact piece which is folded back into U-shaped configuration from the lower end of the main body. Accordingly, the terminals are firmly held on the insulative housing, and engagement between the terminals and the pins of the PGA package is also stabilized, so that it is possible to obtain the highly reliable socket for the PGA package.

Although the present invention has been illustrated and described with respect to exemplary embodiment thereof, should be understood by those skilled in the art that foregoing and various other changes, omissions and additions may be made therein and thereto, without departing from the spirit and scope of the present invention. Therefore, present invention should not be understood as limited to the specific embodiment set out above but to include all possible embodiments which can be embodied within a scope encompassed and equivalents thereof with respect to the feature set out in the appended claims.

What is claimed is:

1. A socket for a PGA package including a planar insulative housing for mounting a plurality of terminals in grid array fashion, each of said terminals comprising:

a planar main body extending in the direction of mounting to said insulative housing;

an anchor portion for engaging with said insulative housing on side edges of said main body;

a contact piece folded back into generally U-shaped configuration from a lower end of said main body and mutually opposing to said main body, said contact piece having an inner portion facing said main body and an outer portion facing away from said main body, the contact piece having a contact portion on the outer portion of the contact piece for contacting with a pin of said PGA package; and a solder tail extending toward a printed circuit board.

2. A socket for a PGA package as set forth in claim 1, wherein each of said terminals is mounted to said insulative housing from a surface opposite to said printed circuit board, and said anchor portion is fixed into engagement with said insulative housing.

3. A socket for a PGA package as set forth in claim 2, wherein each of said terminals is connected to a carrier at an upper end of said main body via tabs, and said tabs are cut to remove said carrier after mounting said terminals to said insulative housing.

4. A socket for a PGA package as set forth in claim 1, wherein said solder tail and said contact piece are extended from an inner side portion with respect to said anchor portion at said lower end of said main body.

5. A socket for a PGA package as set forth in claim 4, wherein said insulative housing includes a terminal mounting portion provided with an overhang portion, and said overhang portion covers said anchor portion between said main body and said contact piece.

6. A socket for a PGA package as set forth in claim 1, wherein said contact piece is straightly extended from said lower end of said main portion to said contact portion.

7. A socket for a PGA package as set forth in claim 3, wherein said terminal is constructed by folding back said contact piece on said main body side, after stamping a terminal blank from a resilient metal sheet into a configuration in which said terminal blank is connected to said carrier via said tabs.

8. A socket for a PGA package, as set forth in claim 7, wherein said solder tail is obliquely formed in such a manner that the distance from said contact piece becomes greater toward the tip end of said solder tail, before being folded back.

9. A socket for a PGA package including a planar insulative housing for mounting a plurality of terminals in grid array fashion, each of said terminals comprising:

a planar main body extending in the direction of mounting to said insulative housing;

an anchor portion for engaging with said insulative housing on side edges of said main body and said anchor portion is fixed into engagement with said insulative housing;

a contact piece folded back into generally U-shaped configuration from a lower end of said main body and mutually opposing to said main body, said contact piece having an inner portion facing said main body and an outer portion facing away from said main body, the contact piece having a contact portion on the outer portion of the contact piece for contacting with a pin of said PGA package;

a solder tail extending toward said printed circuit board; and wherein each of said terminals is mounted to said insulative housing from a surface opposite to said printed circuit board.

10. A socket for a PGA package as set forth in claim 9, wherein each of said terminals is connected to a carrier at an upper end of said main body via tabs, and said tabs are cut to remove said carrier after mounting said terminals to said insulative housing.

11. A socket for a PGA package as set forth in claim 9, wherein said solder tail and said contact piece are extended from an inner side portion with respect to said anchor portion at said lower end of said main body.

12. A socket for a PGA package as set forth in claim 11, wherein said insulative housing includes a terminal mounting portion provided with an overhang portion, said overhand portion covers said anchor portion between said main body and said contract piece.

13. A socket for a PGA package as set forth in claim 9, wherein said contact piece is straightly extended from said lower end of said main portion to said contact portion.

14. A socket for a PGA package as set forth in claim 10 wherein said terminal is constructed by folding back said contact piece on said main body side, after stamping a terminal blank from a resilient metal sheet into a configuration in which said terminal blank is connected to said carrier via said tabs.

15. A socket for a PGA package as set forth in claim 14, wherein said solder tail is obliquely formed in such a manner that the distance from said contact piece becomes greater toward the tip end of said solder tail, before being folded back.

16. A terminal for use in a PGA socket connector, the terminal comprising:

a main body; and a contact piece folded back into generally U-shaped configuration from a lower end of the main body and mutually opposing to the main body, the contact piece having an inner portion facing the main body and an outer portion facing away from the main body, the contact piece having a contact portion on the outer portion of the contact piece for contacting with a pin of a PGA package.

17. A PGA socket connector, the connector including an insulative housing for mounting a plurality of terminals, each of the terminals comprising:

a main body; and a contact piece folded back into generally U-shaped configuration from a lower end of the main body and mutually opposing to the main body, the contact piece having an inner portion facing the main body and an outer portion facing away from the main body, the contact piece having a contact portion on the outer portion of the contact piece for contacting with a pin of a PGA package.

18. The connector of claim 17, wherein each of the terminals includes a solder tail portion extending away from a bottom face of the insulative housing.

19. The connector of claim 18, wherein the solder tail includes a generally planar portion at a distal end of the solder tail.

20. The connector of claim 18, wherein the generally planar portion of the solder tail is generally parallel to the bottom face of the insulative housing.

* * * * *